United States Patent
Takahashi

(10) Patent No.: US 7,294,927 B2
(45) Date of Patent: Nov. 13, 2007

(54) SEMICONDUCTOR CHIP PACKAGE AND MANUFACTURING METHOD THEREOF

(75) Inventor: Norio Takahashi, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 39 days.

(21) Appl. No.: 11/387,690

(22) Filed: Mar. 24, 2006

(65) Prior Publication Data

US 2006/0220260 A1 Oct. 5, 2006

(30) Foreign Application Priority Data

Mar. 31, 2005 (JP) .............................. 2005-102739

(51) Int. Cl.
*H01L 23/34* (2006.01)

(52) U.S. Cl. ...................... 257/724; 438/108

(58) Field of Classification Search ................ 257/723, 257/724, 778, 787; 438/107, 108, 110
See application file for complete search history.

(56) References Cited

U.S. PATENT DOCUMENTS

| | | | |
|---|---|---|---|
| 6,638,789 B1 * | 10/2003 | Glenn et al. ................ | 438/109 |
| 7,183,622 B2 * | 2/2007 | Heck et al. ................ | 257/528 |
| 7,230,331 B2 * | 6/2007 | Chen et al. ................ | 257/687 |

* cited by examiner

*Primary Examiner*—S. V. Clark
(74) *Attorney, Agent, or Firm*—Rabin & Berdo, PC

(57) ABSTRACT

An acceleration sensor chip package comprises a frame section, a first semiconductor chip corresponding to an MEMS chip having a plurality of first bumps, a second semiconductor chip having a plurality of second bumps, a substrate on which the first and second semiconductor chips are mounted in parallel with each other and which has a plurality of electrode pads directly connected to the first or second bumps in opposing relationship to the first or second bumps, and external terminals respectively connected to the electrode pads, a closed ring-shaped first sealing section which seals a space defined between the frame section and the substrate so as to surround arrangements of the plurality of first bumps, and a second sealing section which covers the first semiconductor chip, the second semiconductor chip and the first sealing section to seal them.

16 Claims, 7 Drawing Sheets

SEMICONDUCTOR CHIP PACKAGE AND MANUFACTURING METHOD THEREOF

BACKGROUND OF THE INVENTION

The present invention relates to a semiconductor chip package and a manufacturing method thereof, and to a semiconductor chip having a configuration suitable for application to such a semiconductor chip package.

There has been developed a technique for manufacturing an approximately few hundred-μm microstructure using a micromachining technique that applies a semiconductor micro-fabrication technique. Applications to, for example, various sensors, an optical switch in an optical communication field, high-frequency (RF) parts, etc. have started.

Since such a microstructure can be fabricated by a conventional semiconductor manufacturing process, it can be integrated into a single chip.

A chip including a microstructure, in which a system having a specific function has been constructed, is referred to as "Micro-Electrical-Mechanical-Systems: MEMS" or "Micro-System-Technology: MIST" (hereinafter called simply "MEMS chip"). A so-called acceleration sensor chip is known as such a MEMS chip (refer to, for example, a patent document 1 (Japanese Patent Application Laid-Open No. He 11(1999)-135804).

According to the configuration of a piezo type acceleration sensor chip disclosed in the present document, a casement-like frame is provided. The frame includes a central portion and a beam section. The beam section extends between at least part of an inner peripheral side surface of the frame and the central portion. A weight portion is swingably supported by the central portion. A support member supports the lower surface side of the frame and surrounds the outer peripheral edge of the weight portion through a cut portion.

Since the weight portion is of a constituent portion which makes a movement in response to an external force (stress), it is also called "a movable section". The movable section and the beam section are fabricated and mounted as an integral microstructure. The beam section is formed in a thin-walled fashion and with a narrow width.

The sensor chip having such a configuration is generally referred to as a packaged device.

A configuration example of a conventional acceleration sensor chip package will be explained below with reference to FIG. 7.

FIG. 7(A) is a schematic plan view for describing constituent elements, as viewed from the upper or top surface side of the conventional acceleration sensor chip package. Incidentally, in order to show an internal configuration thereof, the illustration of the upper surface side of a protective cover (to be described later) also called "LID" in general is omitted, and the present figure is shown as a transparent diagram. FIG. 7(B) is a typical view showing a cut area cut along alternate long and short dashed lines indicated by A-A' of FIG. 7(A).

The acceleration sensor chip package 100 is provided with an acceleration sensor chip 110. The acceleration sensor chip 110 has electrode pads 112. The electrode pads 112 are pads for outputting signals sent from the acceleration sensor chip 110 or inputting signals to the acceleration sensor chip 110. A mechanically operated movable structure 114 is fabricated and built in the acceleration sensor chip 110.

Further, the acceleration sensor chip 110 has a sealing or encapsulating substrate 116 which seals the movable structure 114 and controls its operation. The sealing substrate 116 is bonded to a substrate 120 by an adhesive 122.

The edges of a release or open hole of the protective cover 130 are adhered to the substrate 120. The protective cover 130 defines a closed space 140 for sealing the acceleration sensor chip 110.

External terminals 150 are provided at their corresponding edges of the substrate 120. The external terminals 150 are led out from the interior of the closed space 140 defined in cooperation with the protective cover 130 to the outside thereof. The electrode pads 112 of the sensor chip 110 and the external terminals 150 are respectively electrically connected to one another by bonding wires 160 within the closed space 140.

According to the conventional acceleration sensor chip package referred to above, the acceleration sensor chip and the external terminals are electrically connected to one another by the bonding wires 160. The protective cover is used to seal the acceleration sensor chip while the bonding wires 160 are being held in the package. Thus, it is not possible to carry out a transfer mold and sealing by potting using a liquid resin, and it is difficult to make the thickness of the package thinner, thereby leading to an increase in occupied volume of the package.

With multifunctioning of electronic equipment such as a cellular phone, there has recently been a desire for the development of a technique for achieving a further reduction in the size of a semiconductor chip package including an MEMS chip in particular.

SUMMARY OF THE INVENTION

The present invention has been made in view of the foregoing problems. It is an object of the present invention to provide a semiconductor chip package which solves the aforementioned problems and mainly includes the following configuration.

That is, the semiconductor chip package includes a first semiconductor chip corresponding to an MEMS chip. The first semiconductor chip has a frame section having an upper surface and a lower surface opposite to the upper surface, a movable structure including a movable section provided within the frame section, and a plurality of first bumps arranged on the upper surface side of the frame section along the edges of the upper surface.

Also the semiconductor chip package of the present invention includes a second semiconductor chip. The second semiconductor chip has a first surface and a second surface opposite to the first surface, and includes a plurality of second bumps arranged on the first surface side along the edges of the first surface.

These first and second semiconductor chips are mounted on a substrate in parallel with each other.

The substrate has a first main surface and a second main surface opposite to the first main surface. The substrate has a plurality of electrode pads provided on the first main surface side. Further, the substrate has external terminals provided on the second main surface side.

The first bumps of the first semiconductor chip or the second bumps of the second semiconductor chip are respectively directly connected to the electrode pads in opposing relationship to the electrode pads.

The semiconductor chip package is provided with a closed ring-shaped first sealing section. The first sealing section seals a space defined between the frame section and the substrate so as to surround arrangements of the plurality of first bumps.

The semiconductor chip package is provided with a second sealing section. The second sealing section covers the first semiconductor chip, the second semiconductor chip, the first sealing section and the first main surface to seal them.

A method for manufacturing the semiconductor chip package, according to the present invention mainly includes the following process steps.

A first semiconductor chip corresponding to an MEMS chip, including a frame section having an upper surface and a lower surface opposite to the upper surface, a movable structure including a movable section provided within the frame section, and a plurality of first bumps arranged on the upper surface side of the frame section along the edges of the upper surface is prepared.

A second semiconductor chip having a first surface and a second surface opposite to the first surface and having a plurality of second bumps arranged on the first surface side along the edges of the first surface is prepared.

A substrate is prepared which has a first main surface and a second main surface opposite to the first main surface and includes a plurality of electrode pads provided on the first mains surface side and respectively connected with the first or second bumps, and external terminals respectively connected to the electrode pads and provided on the second main surface side.

The electrode pads of the substrate and the first or second bumps are directly connected in opposing relationship, and the first and second semiconductor chips are mounted over the substrate in parallel with each other on the first main surface side.

A closed ring-shaped first sealing section, which surrounds the arrangements of the plurality of first bumps, is formed to seal a space defined between the frame section of the first semiconductor chip and the substrate.

A second sealing section, which covers the first semiconductor chip, the second semiconductor chip, the first sealing section and the first main surface, is formed to seal them.

According to the configuration of the semiconductor chip package of the present invention, a plurality of semiconductor chips are placed in parallel on a substrate and brought into packaged form. It is therefore possible to make the thickness of the package thinner. The substrate and the semiconductor chips are so-called flip-chip connected. Thus, remarkable miniaturization of the semiconductor chip package is realized.

Further, according to the semiconductor chip package manufacturing method of the present invention, the semiconductor chip package having the above configuration can be manufactured with extremely efficiency.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1A:
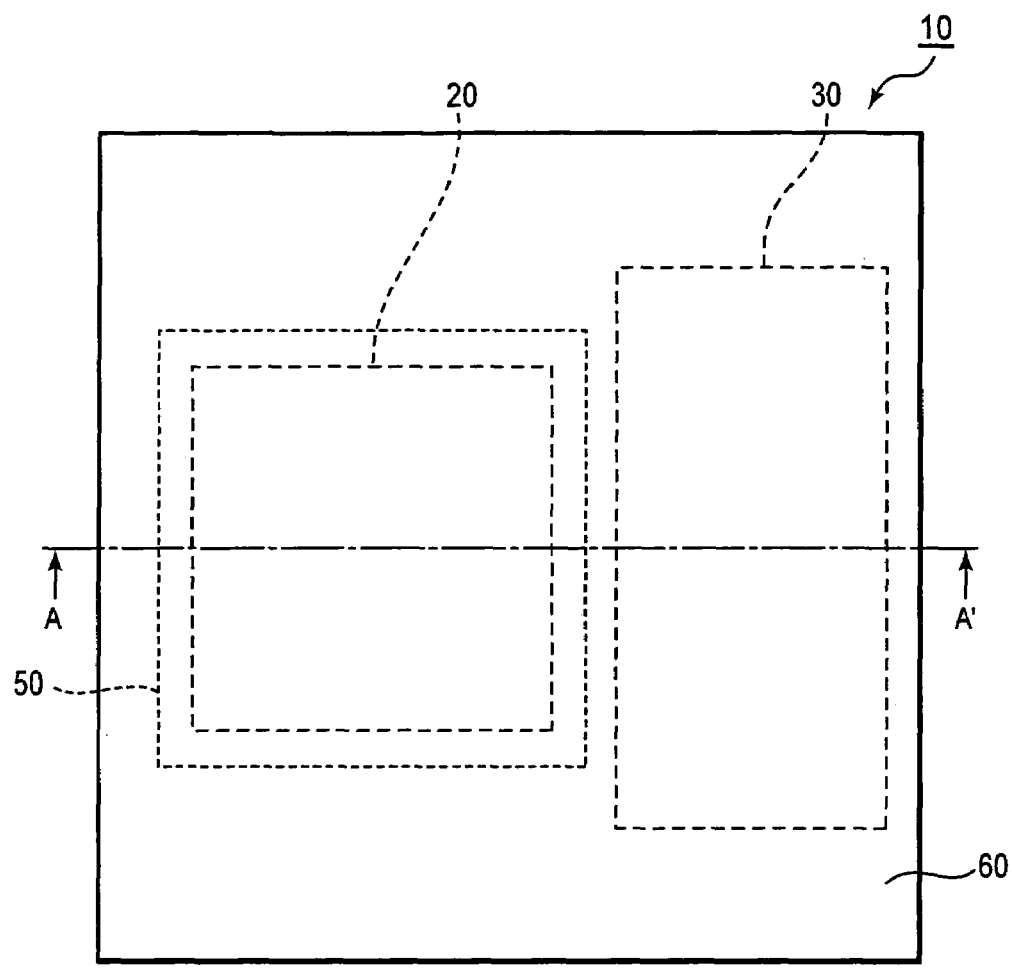
FIG. 1(A) is a schematic plan view for describing constituent elements, as viewed from the side above a semiconductor chip package showing a first embodiment of the present invention.

Preferred embodiments of the present invention will hereinafter be described with reference to the accompanying drawings. Incidentally, the shape, size and layout or physical relationships of each constituent element or component in the figures are merely approximate illustrations to enable an understanding of the present invention. Accordingly, the present invention is not limited to only examples illustrated in the figures in particular.

Although particular materials, conditions and numerical conditions or the like might be used in the following description, these are nothing more than preferred examples. Accordingly, the present invention is by no means limited to these preferred examples.

Further, be cognizant of the fact that in the respective figures used in the following description, similar constituent elements or components are given the same reference numerals and dual explanations of the same elements might be omitted.

First Preferred Embodiment (Configuration of Semiconductor Chip Package)

A configuration example of a first embodiment of the present invention will first be explained with reference to FIGS. 1 through 3. As an example of a semiconductor chip package, an acceleration sensor chip package including a so-called piezo type acceleration sensor chip provided with a piezo resistive element will now be explained by way of example.

The acceleration sensor chip described here is of a semiconductor chip capable of measuring predetermined acceleration. The acceleration sensor chip package means a semiconductor chip package corresponding to a packaged device including such an acceleration sensor chip.

Figure 1B:
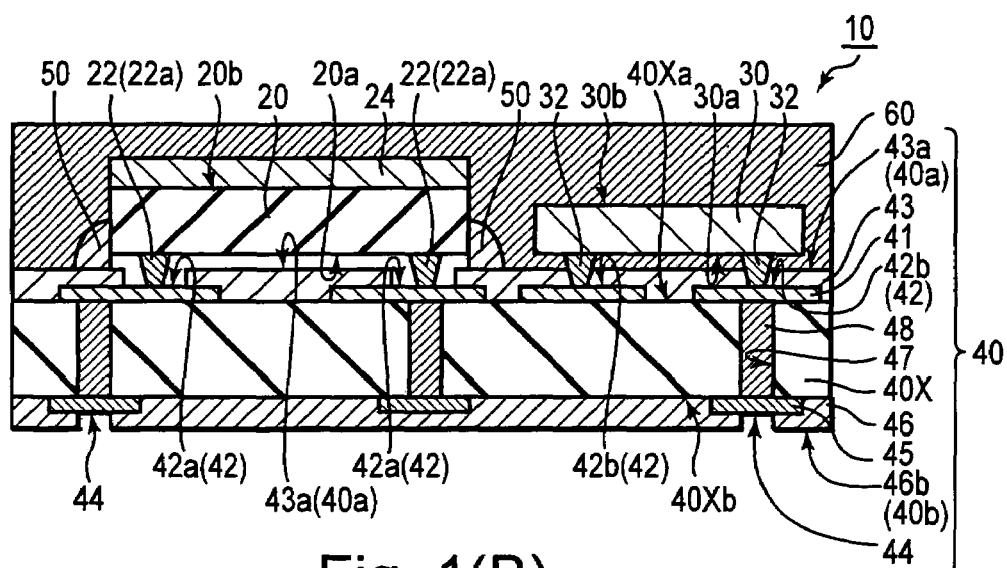
FIG. 1(B) is a typical view showing a cut area cut along alternate long and short dashed lines indicated by A-A' of FIG. 1(A)

FIG. 1(A) is a schematic plan view for describing components or constituent elements, as viewed from the side above the acceleration sensor chip package of the first embodiment. FIG. 1(B) is a typical view showing a cut area cut along alternate long and short dashed lines indicated by A-A' of FIG. 1(A).

As shown in FIGS. 1(A) and 1(B), the semiconductor chip package 10 includes a first semiconductor chip 20. As the first semiconductor chip 20 applied to the semiconductor chip package 10 of the present invention, various MEMS chips each provided with the above movable structure can be applied.

The first semiconductor chip 20 has an upper surface 20a and a lower surface 20b opposite to the upper surface 20a.

The first semiconductor chip 20 has a plurality of first bumps 22. These plural first bumps 22 are arranged along the edges of the upper surface 20a. The details of a construction peculiar to the acceleration sensor chip, of the movable structure or the like will be described later. Incidentally, a glass plate 24 is provided on the lower surface 20b to protect the movable structure in the present example.

Also the semiconductor chip package 10 includes a second semiconductor chip 30. The second semiconductor chip 30 has a first surface 30a and a second surface 30b opposite to the first surface 30a. The second semiconductor chip 30 includes a plurality of second bumps 32 arranged on the first surface 30a side along the edges of the first surface 30a in the present example. The second bumps 32 may be provided in matrix form.

In the present example, the second semiconductor chip 30 is of a control chip for controlling the operation of the first semiconductor chip 20. The control chip mentioned here corresponds to a semiconductor chip capable of controlling the operation of the MEMS chip and swapping signals with the MEMS chip to thereby execute an appropriate and suitable process. As the control chip, chips each of which fulfills one or two desired functions selected from so-called amplifier, angle correcting, AD-converting, DA-converting and memory functions, etc., can be suitably selected and applied. In the example illustrated in the figure, one semiconductor chip is mounted on a substrate in addition to the MEMS chip. However, the present invention is not limited to it but two or more semiconductor chips may be configured so as to be mounted on the substrate in addition to the MEMS chip.

The semiconductor chip package 10 includes a substrate 40. As the substrate 40, ceramic having a wiring structure including through holes, via holes, buried contacts and multilayered or single-layered wiring connected thereto, and an insulating film, a heat-resisting glass epoxy resin wiring board, a wiring board with a heat-resistant polymeric material like a BT resin as a base material 40X can be used.

The substrate 40 has a first main surface 40a and a second main surface 40b opposite to the first main surface 40a. Also the substrate 40 has a plurality of electrode pads 42 exposed from the first main surface 40a. The layout positions and number of these plural electrode pads 42 may be set in consideration of the numbers and layout positions of the first and second bumps 22 and 32 of the first and second semiconductor chips 20 and 30, which are respectively connected to the electrode pads 42.

Further, the substrate 40 has a plurality of external terminals 44. The external terminals 44 are provided so as to be exposed from the second main surface 40b. The external terminals 44 function as electrodes for electrically connecting the semiconductor chip package 10 to a mounting board or the like.

In the present example, the substrate 40 has a single-layered wiring structure. The substrate 40 has a first wiring layer 41 including a plurality of wiring sections, which is provided on a surface 40Xa of the base material 40X placed on the first main surface 40a side. A first insulating film 43 is provided on the first wiring layer 41 so as to cover the first wiring layer 41. The first insulating film 43 in which a surface 43a thereof functions as the first main surface 40a of the substrate 40, is provided with openings, which expose parts of the wiring sections of the first wiring layer 41. The exposed sections are configured as the electrode pads 42. The electrode pads 42 include first semiconductor chip connecting pads 42a and second semiconductor chip connecting pads 42b respectively in the present example. The first semiconductor chip connecting pad 42a is of an electrode pad connected to the first bump 22 of the first semiconductor chip 20. The second semiconductor chip connecting pad 42b is of an electrode pad connected to the second bump 32 of the second semiconductor chip 30.

Similarly, the substrate 40 has a second wiring layer 45 including a plurality of wiring sections provided on a back surface 40Xb of the base material 40X placed on the second main surface 40b side. A second insulating film 46 is provided on the second wiring layer 45 so as to cover the second wiring layer 45. A surface 46b of the second insulating film 46 corresponds to the second main surface 40b of the substrate 40.

The second insulating film 46 is provided with openings, which expose parts of the wiring sections of the second wiring layer 45. The exposed sections are configured as the external terminals 44. Although the external terminals 44 are illustrated as planar pads in the present example, they can also connect solder bumps or the like.

The first and second semiconductor chips 20 and 30 are mounted over the substrate 40. The first and second semiconductor chips 20 and 30 are mounted thereon in parallel with each other. At this time, the first bumps 22 of the first semiconductor chip 20 and the second bumps 32 of the second semiconductor chip 30 are respectively connected directly to the electrode pads 42, so-called flip-chip connected thereto in opposing relationship to the electrode pads 42. That is, the first and second semiconductor chips 20 and 30 are mounted in such a manner that the upper surface 20a and the first surface 30a are perfectly exposed as viewed from the mounting-face sides of the first and second semiconductor chips 20 and 30.

The semiconductor chip package 10 is equipped with a first sealing section 50. The first sealing section 50 has a closed ring shape. The first sealing section 50 buries a space between the first semiconductor chip 20 and the substrate 40 and seals and defines a gap having an extent of such a degree as not to interfere with the operation of the movable structure (to be described later in detail) provided in the first semiconductor chip 20 corresponding to the MEMS chip (acceleration sensor chip). That is, the first sealing section 50 is brought into contact with the side surfaces of the first semiconductor chip 20 and the first main surface 40a of the substrate 40 and provided so as to surround arrangements of the plurality of first bumps 22.

The first sealing section 50 may preferably be used with a non-conductive adhesive known to date. As the first sealing section 50, an adhesive having a viscosity ranging from approximately 7 Pa·s to 900 Pa·s may preferably be used so as not to interfere with the operation of the movable structure upon its formation.

The semiconductor chip package 10 is provided with a second sealing section 60. The second sealing section 60 seals the first semiconductor chip 20, the second semiconductor chip 30, the first sealing section 50 and the first main surface 40a of the substrate so as to cover them from thereabove. At this time, the second sealing section 60 seals the constituent elements provided on the first main surface 40a side of the substrate 40 and constitutions or constituents mounted on the first main surface 40a side in a state in which a gap area corresponding to the space between the first semiconductor chip 20 and the substrate 40, which is defined by the above first sealing section 50 that seals the movable structure of the first semiconductor chip 30 operably, is being maintained. An arbitrary and suitable liquid resin or the like known to date can be applied as a material for forming the second sealing section 60.

Since a plurality of semiconductor chips are packaged on the substrate with being arranged in parallel in the case of such a semiconductor chip package, its thickness can be made thinner. The substrate and the semiconductor chips are in so-called flip-chip connection. Thus, remarkable miniaturization of the semiconductor chip package is realized.

(Configuration Example 1 of First Semiconductor Chip)

A configuration example (1) of the first semiconductor chip suitable for application to the semiconductor chip package of the present invention will now be explained with reference to FIGS. 2 and 3.

Figure 2:
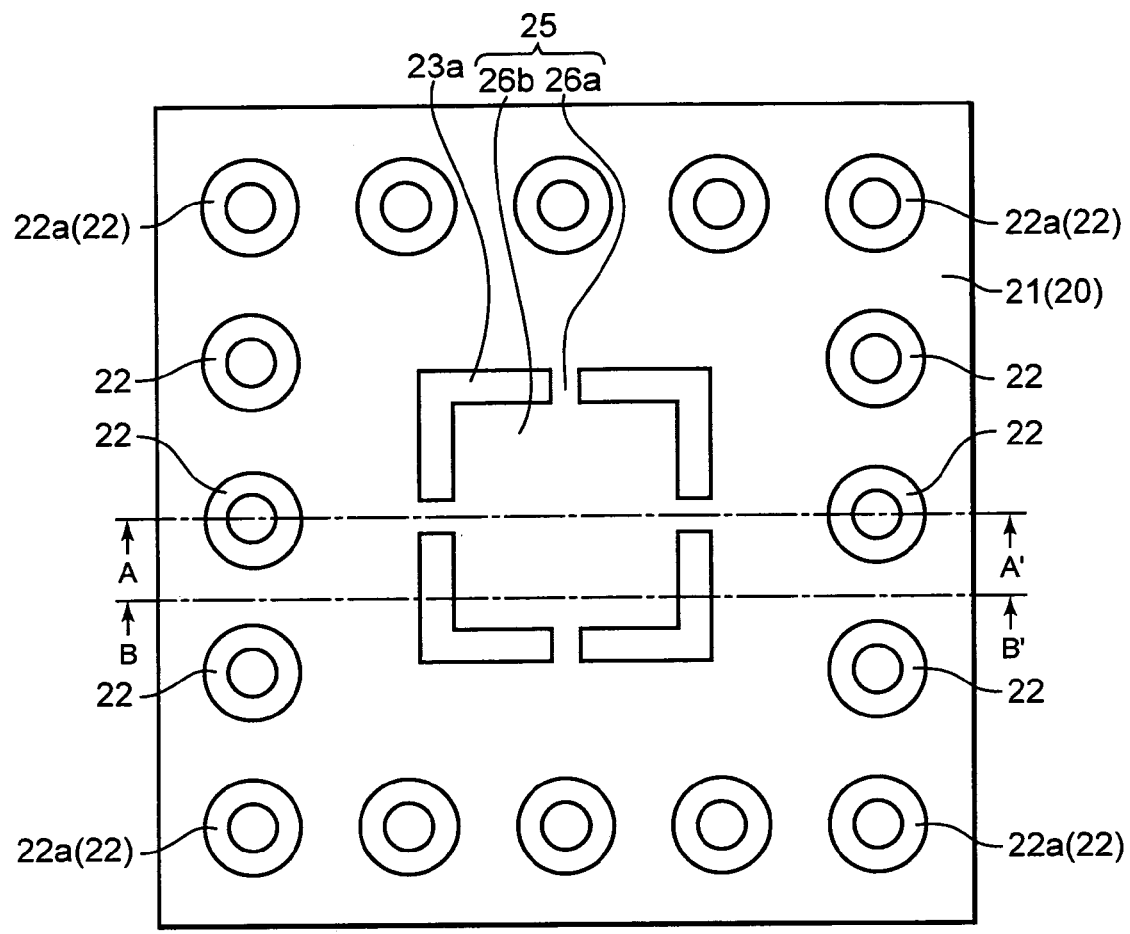
FIG. 2 is a schematic explanatory view for describing constituent elements of an MEMS chip suitable for application to an acceleration sensor chip package of the present invention.

FIG. 2 is a schematic plan view for describing constituent elements, as viewed from the side above an acceleration sensor chip suitable for application to the acceleration sensor chip package of the present invention.

Figure 3A:
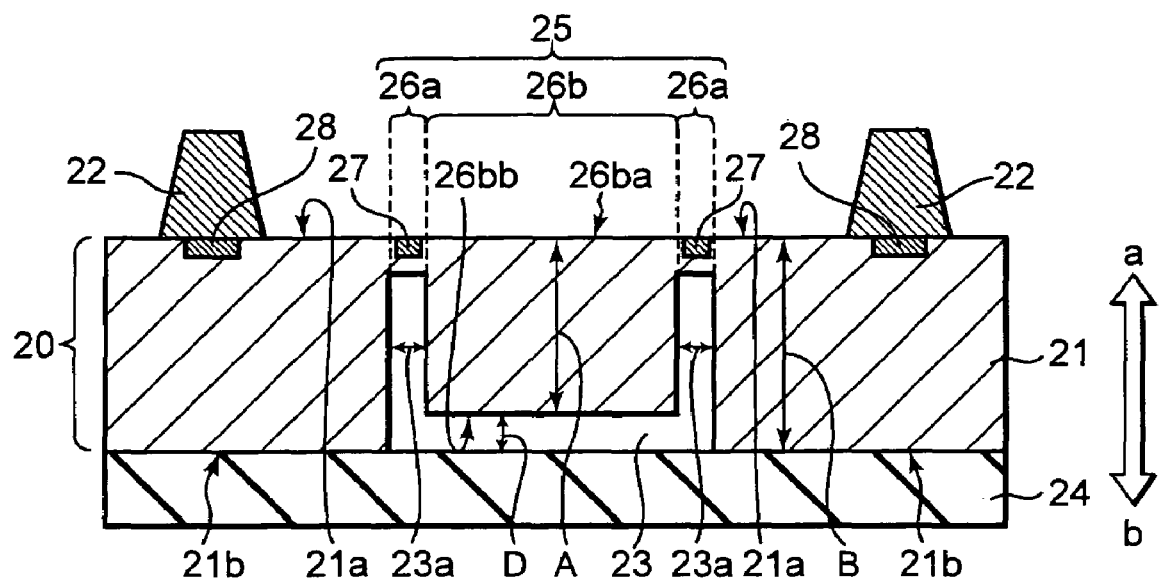
FIGS. 3(A) and 3(B) are typical views respectively showing cut areas cut along alternate long and short dashed lines indicated by A-A' and B-B' of FIG. 2.
Figure 3B:
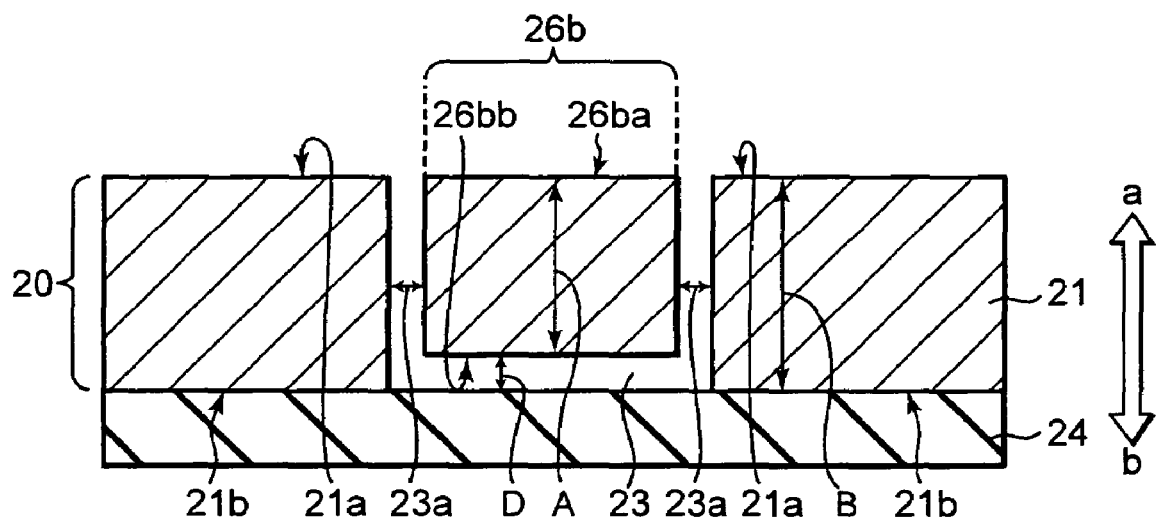

FIG. 3(A) is a typical view showing a cut area cut along alternate long and short dashed lines indicated by A-A' of FIG. 2, and FIG. 3(B) is a typical view showing a cut area cut along alternate long and short dashed lines indicated by B-B' of FIG. 2, respectively.

As shown in FIG. 2 and FIGS. 3(A) and 3(B), the acceleration sensor chip 20 according to the present example is a so-called triaxial acceleration sensor chip. The acceleration sensor chip 20 includes a frame section 21. The frame section 21 has a frame-section upper surface 21a and a frame-section lower surface 21b opposite to the frame-section upper surface 21a. In the present example, the frame section 21 is of a square frame-shaped outer frame that defines the outer shape (contour) of the acceleration sensor chip 20.

The acceleration sensor chip 20 is provided with an opening 23. In the present example, the opening 23 is surrounded by the square frame-shaped frame section 21 and provided as a through hole that extends from the frame-section upper surface 21a of the frame section 21 to the frame-section lower surface 21b thereof.

The acceleration sensor chip 20 is provided with a movable structure 25. The movable structure 25 has a beam section 26a and a movable section 26b. The movable section 26b is movably provided with being connected integrally with the beam section 26a.

The beam section 26a extends from the frame section 21 so as to protrude within the opening 32. The beam section 26a is thin-walled and made narrow in width. The beam section 26a is a flexible portion that flexes upon motion of the movable section 26b.

The movable section 26b referred to above is provided on the leading end side of the beam section 26a, which protrudes into the opening 23. The movable section 26b is suspended within the opening 23 by the beam section 26a and accommodated within the opening 23.

The height of an upper surface 26ba of the movable section 26b is substantially identical to that of each of the frame section 21 and the beam section 26a. The thickness A of the movable section 26b is made thinner than the thickness B of the frame section 21. That is, the movable section 26b is supported in midair within the opening 23 by the beam section 26a.

The movable structure 25 is fabricated and mounted into a silicon wafer, for example. The frame section 21 and the beam section 26a are integrally formed in a connected fashion. Owing to the connected portions, the frame section 21 supports the beam section 26a, and the beam section 26a supports the movable section 26b.

The movable section 26b needs to be configured in such a manner that it can be moved (displaced) in directions indicated by arrows a and b shown in FIGS. 3(A) and 3(B) for the measurement of acceleration. Thus, in order to prevent the movable section 26b and the frame section 21 from directly contacting with each other and prevent the motion of the movable section 26b from being restrained by the beam section 26a, spaces 23a separate between the movable section 26b and the frame section 21 and between the side edges of the beam section 26a excluding the connected portions between the frame section 21 and the movable section 26b, and the movable section 26b, respectively (refer to FIG. 3(B)).

In the present example, the movable structure 25 has been described as such a configuration as to include the beam section 26a comprised of four portions, and the movable section 26b supported from four directions by the four portions of the beam section 26a. However, the configuration of the semiconductor chip package of the present invention is not limited to the above-described configuration example. Its configuration can be applied to configurations of all movable structures each provided in the MEMS chip including the acceleration sensor known to date. For instance, a so-called configuration of cantilever type or the like which supports the movable section 26b from one direction alone, can be applied.

In the configuration example shown in FIG. 2 and FIGS. 3(A) and 3(B), the beam section 26a comprised of the four portions that protrude into the opening 23 at right angles from the centers of the respective sides on the frame-section upper surface 21a side, of the square frame-shaped frame section 21, is provided.

The movable section 26b is supported on the leading end sides of the protruded four portions of the beam section 26a. The movable section 26b is shaped in a cubic form in the present example. That is, the flat shape of the movable section 26b is square and the beam section 26a has the four portions respectively connected to the movable section 26b at their corresponding central portions of the four sides of the square corresponding to the upper surface of the cubic.

In the illustrated example, the shape of the movable section 26b was made cubic. However, the shape thereof is not limited to it but can take an arbitrary and suitable desired shape corresponding to expected acceleration, measurement conditions and the like.

The beam section 26a is provided with detecting elements 27.

The detecting elements 27 may be provided in suitable positions with a suitable number corresponding to design, which enables the measurement of acceleration aimed at its measurement. These detecting elements 27 are elements that detect the amount of displacement of the movable structure 25.

The detecting elements 27 are not limited to piezo resistive elements illustrated in the figure. An arbitrary and suitable detecting element can be selected and suitably applied which is applied to an acceleration sensor of an arbitrary type such as an electrostatic capacitance type.

Further, wirings (not shown) for outputting signals to the outside or inputting the signals to the piezo resistive elements are respectively connected to the piezo resistive elements. For instance, a wiring structure known to date can be applied to each wiring. A general material such as aluminum (Al) or the like can be applied as a wiring material.

A plurality of frame-section electrode pads 28 are provided in the frame-section upper surface 21a of the frame section 21. The frame-section electrode pads 28 are provided so as to be exposed from the frame-section upper surface 21a of the frame section 21.

In general, a so-called insulating film such as a passivation film is provided on the surface of a semiconductor chip. That is, the frame-section electrode pads 28 are provided with being exposed from such an insulating film.

The frame-section electrode pads 28 are electrically connected to their corresponding detecting elements 27 of the beam section 26a via the above unillustrated wirings.

The first bumps 22 already described above are respectively connected to the frame-section electrode pads 28 at above.

Thus, the first bumps 22 are respectively electrically connected to the frame-section electrode pads 28 and connected to the detecting elements 27 via the unillustrated wirings connected to the frame-section electrode pads 28.

Arbitrary and suitable ones may be used as the first bumps 22. For example, lead-free solder balls, so-called core balls or the like can be applied to the first bumps 22.

In the present example, the first bumps 22 are provided five every sides, sixteen in total along the edges of the sides of the rectangular frame-section upper surface 21a.

Preferably, the first bumps 22 of the first semiconductor chip 20 may further include one or two or more dummy bumps 22a. The dummy bumps 22 described here are bumps which do not electrically function without being directly connected to the pads, that is, which are not made conductive to the first semiconductor chip 20.

With the provision of such dummy bumps 22a, wobbling of the semiconductor chip can be further reduced upon mounting of the semiconductor chip onto the substrate. It is therefore possible to mount the first semiconductor chip 20 on the substrate 40 stabler. Further, the dummy bumps 22a make it possible to further improve the strength of bonding of the first semiconductor chip 20 to the substrate 40. Thus, the reliability of the package can be more improved.

Of the first bumps 22, the corresponding dummy bumps 22a are respectively provided at the four apex angles of the rectangular frame-section upper surface 21a in the illustrated example.

Conditions such as layout or physical positions of the dummy bumps 22a, the number thereof, etc. are not limited to the illustrated example but can be set to ones arbitrary and suitable within a range in which the above-described advantageous effects are obtained.

(Configuration Example 2 of First Semiconductor Chip)

A configuration example (2) of a first semiconductor chip suitable for application to the semiconductor chip package of the present invention will next be described with reference to FIG. 4 and FIGS. 5(A) and 5(B).

Figure 4:
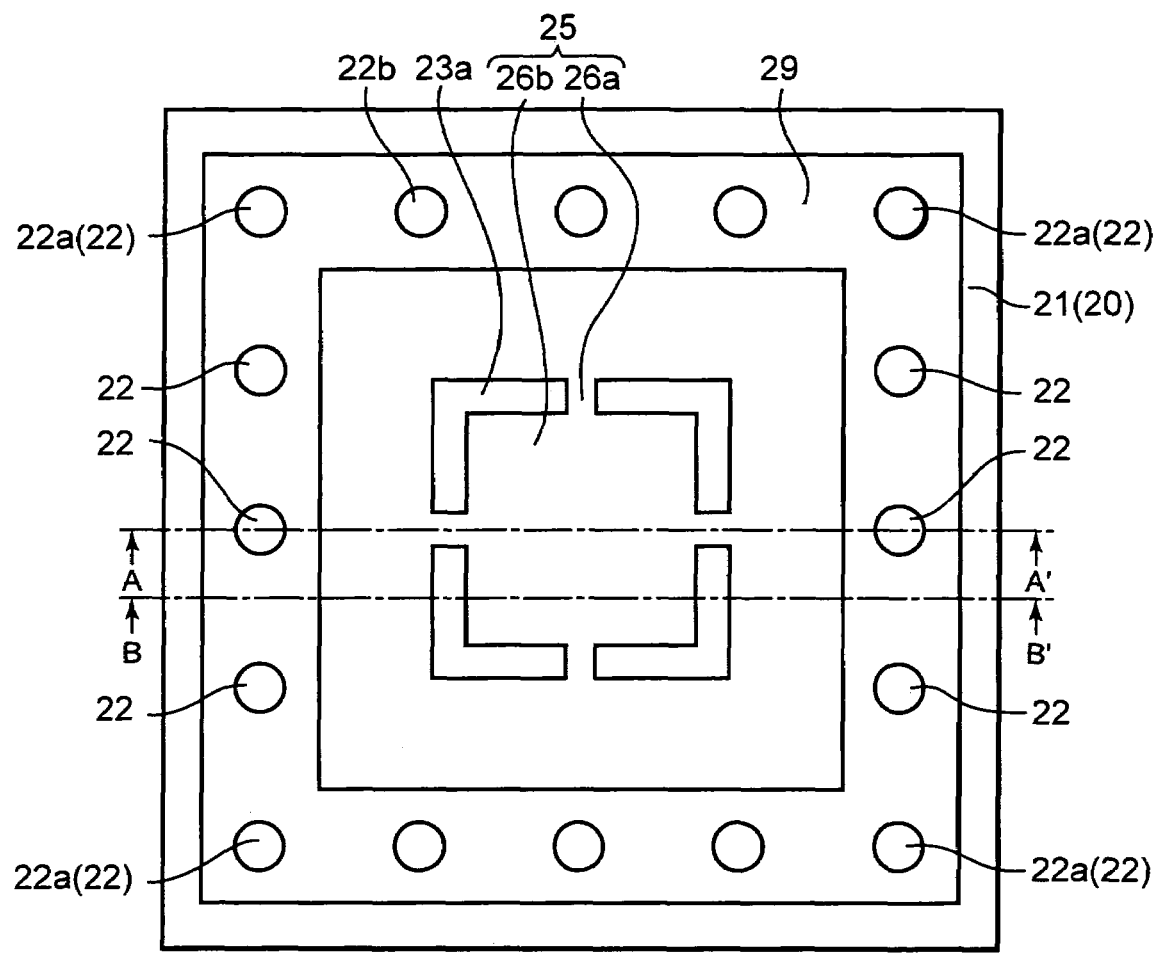
FIG. 4 is a schematic explanatory view for describing constituent elements of an MEMS chip suitable for application to an acceleration sensor chip package of the present invention.

FIG. 4 is a schematic plan view for describing constituent elements, as viewed from the side above an acceleration sensor chip suitable for application to the acceleration sensor chip package of the present invention.

Figure 5A:
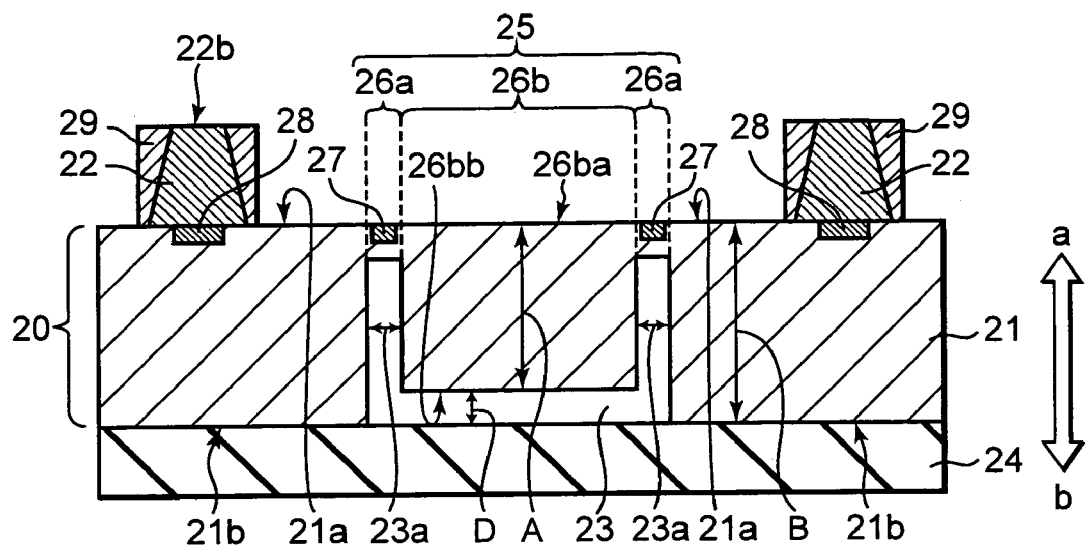
FIGS. 5(A) and 5(B) are typical views respectively illustrating cut areas cut along alternate long and short dashed lines indicated by A-A' and B-B' of FIG. 4.

FIG. 5(A) is a typical view showing a cut area cut along alternate long and dashed lines indicated by A-A' of FIG. 4. FIG. 5(B) is a typical view showing a cut area cut along alternate long and short dashed lines indicated by B-B' of FIG. 4.

Figure 5B:
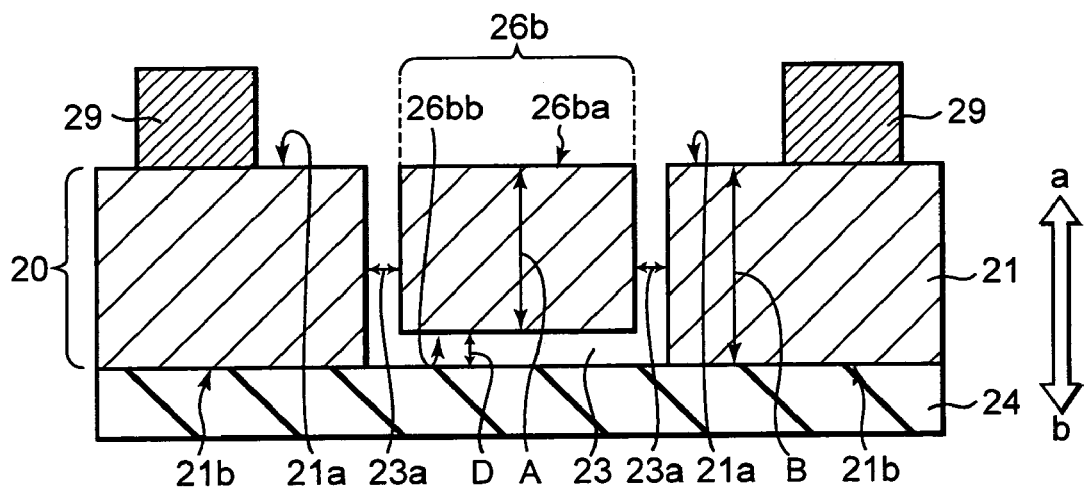

As shown in FIG. 4 and FIGS. 5(A) and 5(B), the acceleration sensor chip 20 according to the present example is characterized in that it further has a closed ring-shaped adhesive 29 in addition to the constitution of the already-described configuration example (1). Since configurations other than the configuration of the closed ring-shaped adhesive 29 are identical to the configuration example (1) of the first semiconductor chip, they are given the same reference numerals and their detailed description will therefore be omitted.

The closed ring-shaped adhesive 29 is provided so as to expose parts of first bumps 22, i.e., top faces 22b of the first bumps 22 in the present example and cover the side faces of the bumps 22. The closed ring-shaped adhesive 29 is provided in contiguous form along the edges of a frame-section upper surface 21a of a frame section 21.

For example, an NCF (Non-Conductive Film) or an ACF (anisotropic conductive film), which is of a film-shaped adhesive known to date, can be used as the closed ring-shaped adhesive 29.

(Method for Manufacturing Semiconductor Chip Package)

A method for manufacturing the semiconductor chip package 10 referred to above will next be described with reference to FIGS. 1 through 5.

Incidentally, the detailed description of the already-described constituent elements of the semiconductor chip package 10 will not be omitted in principle.

A first semiconductor chip 20 corresponding to the MEMS chip will first be prepared. As a process for manufacturing the first semiconductor chip 20 corresponding to the MEMS chip, the arbitrary and suitable manufacturing process known to date can be applied except for the process of forming dummy bumps 22a and a close ring-shaped adhesive 29 (refer to FIG. 4 and FIGS. 5(A) and 5(B)) to be described later. That is, since the manufacturing process of the MEMS chip per se does not correspond to the subject matter of the present invention, its detail description is omitted except for the description of the dummy bumps 22a and closed ring-shaped adhesive 29 each corresponding to the configuration peculiar to the present invention.

When the first semiconductor chip 20 is provided with the already described dummy bumps 22a, the dummy bumps 22a can be formed by a similar process simultaneously with the formation of first bumps 22 other than the dummy bumps 22a. At this time, the dummy bumps 22a may preferably be formed in accordance with arbitrary and suitable bump forming processes such as the plating method, deposition method, transfer method, etc. known to date.

When the first semiconductor chip 20 is being provided with the closed ring-shaped adhesive 29 described with reference to FIGS. 4 and 5, the present adhesive 29, i.e., for example, the already-described NCF or ACF may be bonded or adhered onto its corresponding frame-section upper surface 21a in advance. The bonding of the adhesive 29 thereto is performed by the process of preheating the adhesive 29, arranging a plurality of the first bumps 22 in contiguous form and then covering their top faces 22b while being exposed.

A second semiconductor chip 30 having the already-mentioned configuration and a substrate 40 are next prepared.

Next, the first and second semiconductor chips 20 and 30 are mounted over a first main surface 40a of the substrate 40. At this time, electrode pads 42 of the substrate 40 and first and second bumps 22 and 32 are respectively connected to one another. That is, the first and second semiconductor chips 20 and 30 are respectively mounted on the first main surface 40a side in parallel with each other. Described specifically, the first and second semiconductor chips 20 and 30 may be mounted over the substrate 40 in accordance with arbitrary and suitable processes such as a reflow process known to date, etc. When the first semiconductor chip 20 has the closed ring-shaped adhesive 29, the process of mounting the first semiconductor chip 20 onto the substrate 40 may be performed by a thermocompression bonding process. At this time, a state in which the first semiconductor chip 20 is being mounted on the substrate 40, i.e., the closed ring-shaped adhesive 29 that adheres the first semiconductor chip 20 and the substrate 40 to each other, is also referred to as an adhesive sealing section 29. In this case, the closed ring-shaped adhesive 29, i.e., the adhesive sealing section 29 defines a closed space between the frame section 21 and the first main surface 40a of the substrate 40. That is, a movable structure of the first semiconductor chip 20 is encapsulated in the closed space in a ready or operable condition.

Assuming that such a process is taken, the mounting of the first semiconductor chip 20 onto the substrate 40 and the encapsulation of the movable structure included in the first semiconductor chip 20 corresponding to the MEMS chip can be carried out simultaneously.

A closed ring-shaped first sealing section 50 (refer to FIGS. 1(A) and 1(B)), which seals a space or gap defined between the frame section 21 of the first semiconductor chip 20 and the first main surface 40a of the substrate 40 as a closed space, is formed. The first sealing section 50 seals arrangements of a plurality of the first bumps 22 of the first semiconductor chip 20 so as to cover or surround the arrangements thereof in contiguous form from the side faces of the frame section 21 to the first main surface 40a. The process of forming the first sealing section 50 is as follows: The first sealing section 50 may be formed by supplying a resin material in accordance with, for example, a so-called dispense method using a dispenser having such a configuration as known to date. Incidentally, the present process is unnecessary where the first semiconductor chip 20 has the closed ring-shaped adhesive 29.

Next, a structure placed on the first main surface 40a of the substrate 40 is sealed with a second sealing section 60. The second sealing section 60 is formed so as to cover the first semiconductor chip 20, second semiconductor chip 30, first sealing section 50 and first main surface 40a and thereby seals them. At this time, a movable section of the first semiconductor chip 20 is maintained in a state of being encapsulated in the closed space defined by the first sealing section 50 as mentioned above.

When the adhesive sealing section 29 is being formed, the second sealing section 60 is formed so as to enable the movable section of the first semiconductor chip 20 to operate and so as to cover the first semiconductor chip 20, second semiconductor chip 30, adhesive sealing section 29 and first main surface 40a to seal them. Thus, the movable section is maintained in a state in which it is encapsulated in the closed space defined by the adhesive sealing section 29 in the gap between the first main surface 40a of the substrate 40 and the first semiconductor chip 20.

The second sealing section 60 may be formed using an encapsulating resin material such as an epoxy mold resin, a liquid sealing material. This encapsulating process may be performed by, for example, a dispenser-based injection method, a transfer mold method or a printing method known to date.

Such a manufacturing process makes it possible to manufacture the semiconductor chip package having the above configuration with extremely efficiency.

Second Preferred Embodiment (Configuration of Semiconductor Chip Package)

A configuration example of a second embodiment of the present invention will be explained with reference to FIGS. 6(A) and 6(B).

Figure 6A:
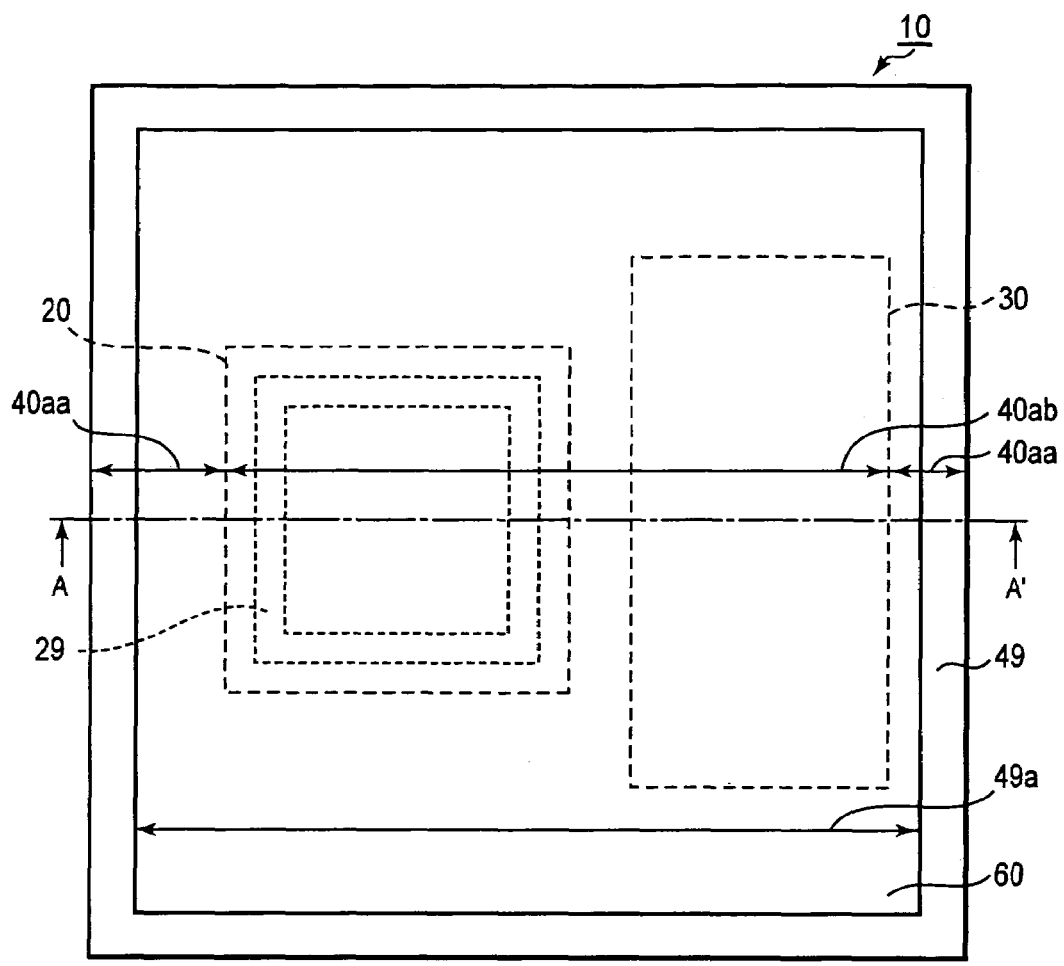
FIG. 6(A) is a schematic plan view for describing constituent elements, as viewed from the side above an acceleration sensor chip package showing a second embodiment of the present invention.

FIG. 6(A) is a schematic plan view for describing constituent elements, as viewed from the side above an acceleration sensor chip package showing the second embodiment. FIG. 6(B) is a typical view showing a cut area cut along alternate long and short dashed lines indicated by A-A' of FIG. 6(A).

The semiconductor chip package 10 according to the present embodiment is characterized in that a so-called ceramic header is applied as a substrate with semiconductor chips mounted thereon. The constituent elements other than the ceramic header are identical to those employed in the first embodiment already mentioned. Thus, the constitutions or constituent elements similar to the first embodiment inclusive of the constituent elements of the ceramic header are given the same reference numerals and their detailed description will therefore be omitted.

The ceramic header described here is a ceramic substrate having a concave portion with the semiconductor chips stored and mounted therein, i.e., a case-like ceramic substrate.

Figure 6B:
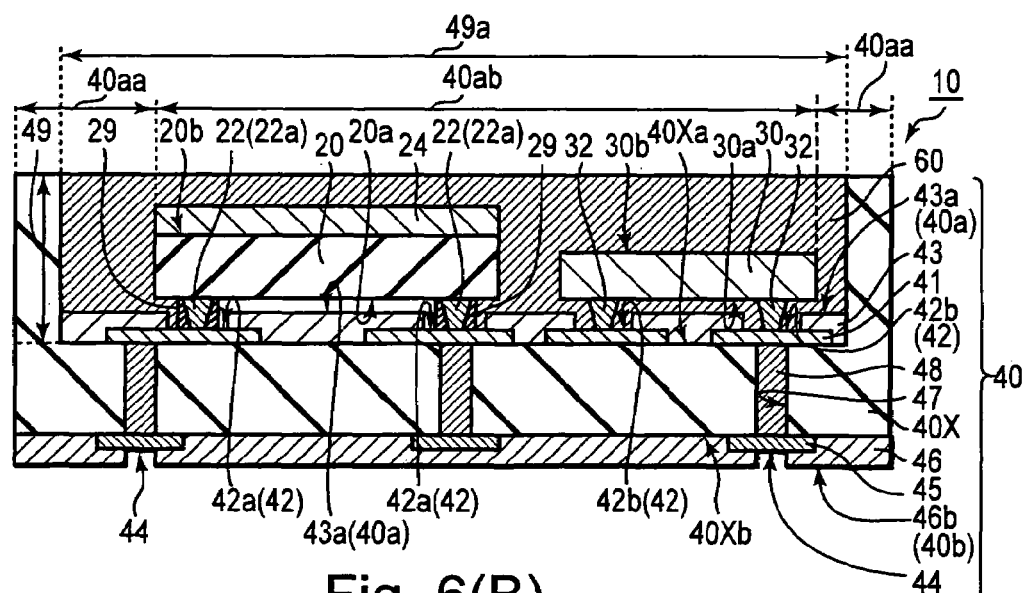
FIG. 6(B) is a typical view showing a cut area cut along alternate long and short dashed lines indicated by A-A' of FIG. 6(A)
Figure 7A:
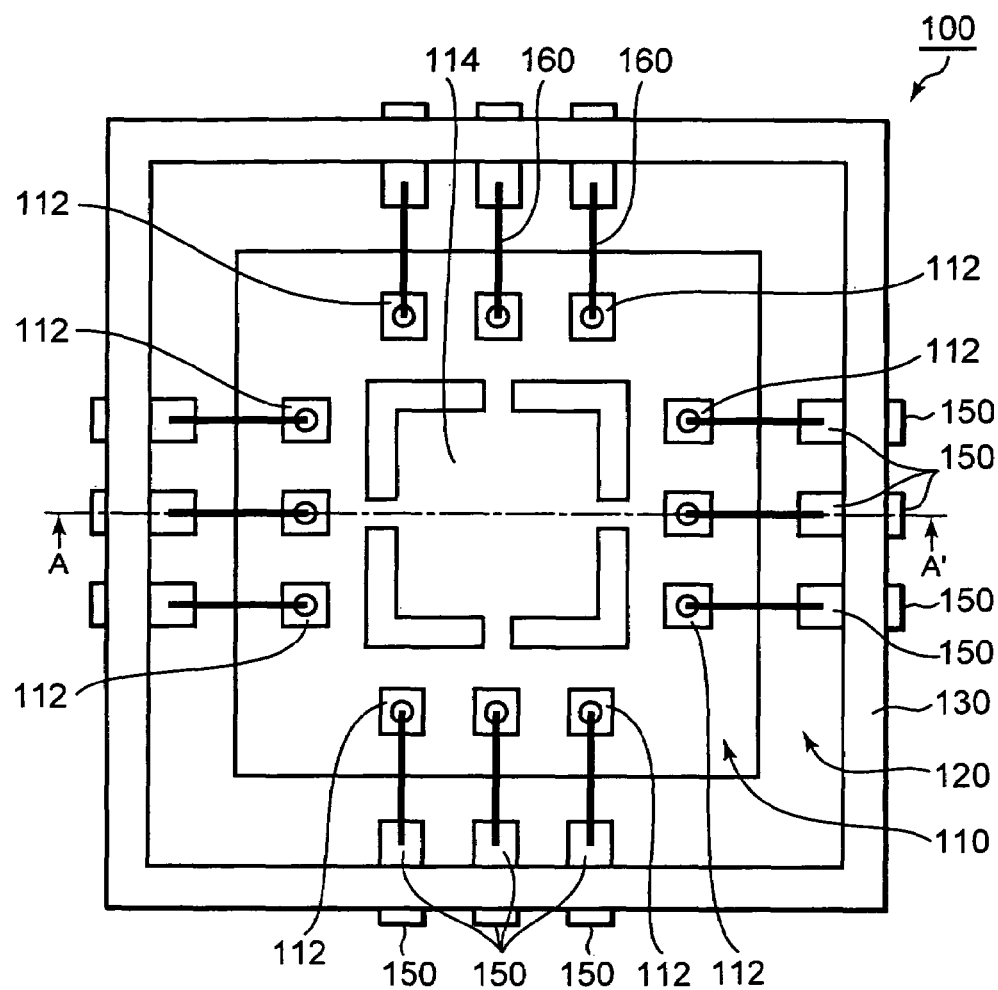
FIG. 7 is an explanatory view of a related art.
Figure 7B:
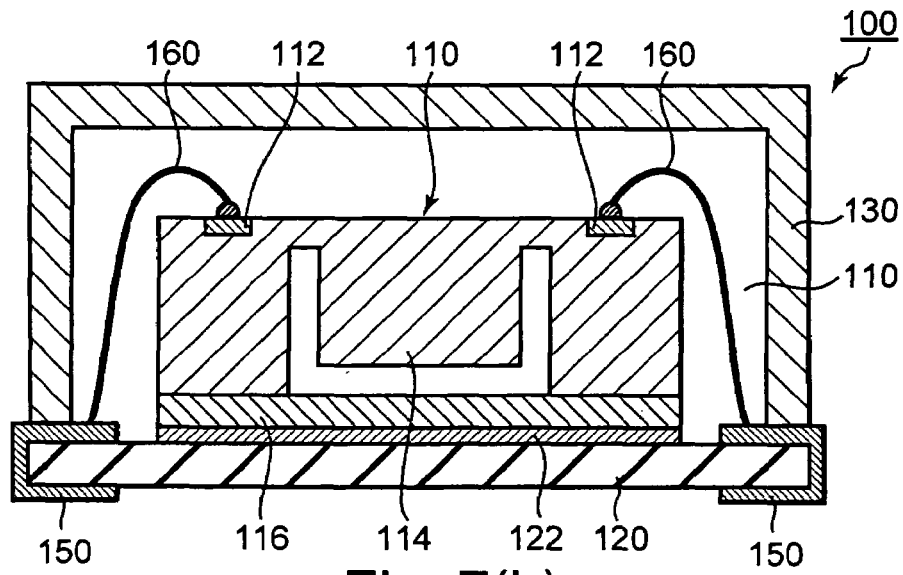

As shown in FIG. 6(B), the ceramic header 40 has a configuration wherein a side wall section 49 defining a concave portion 49a is added to the configuration of the substrate (40) described with reference to FIG. 1. That is, the side wall section 49 is provided in edge areas 40aa of a first main surface 40a.

The edge areas 40aa described here are areas placed outside the edges of first and second semiconductor chips 20 and 30 mounted over the first main surface 40a, i.e., interposed between the respective edges of the first and second semiconductor chips 20 and 30 and the side wall section 49. An area corresponding to an inner bottom face of a case or container with the first and second semiconductor chips 20 and 30 placed inside the edge areas 40aa being mounted therein is also referred to as an inner area 40ab.

The side wall section 49 is provided in the edge areas 40aa upright in the direction orthogonal to the first main surface 40a. As shown in FIG. 6(A), the side wall section 49 is provided in the form of such a closed ring shape as to surround the inner area 40ab in contiguous form.

In a manner similar to the configuration of the substrate 40 employed in the first embodiment, a first wiring layer 41, electrode pads 42, a first insulating film 43, external terminals 44, a second wiring layer 45, a second insulating film 46, through holes 47 and buried contacts 48, etc. are provided in the inner area 40ab.

The configuration of the semiconductor chip package 10 according to the present embodiment will be explained specifically below. In the present example, such a configuration that the first semiconductor chip 20 having the already-mentioned closed ring-shaped adhesive 29 is mounted onto the ceramic header 40 will be explained. However, the configuration of the semiconductor chip package 10 according to the present embodiment is not limited to the present example. In a manner similar to the first embodiment, such a configuration that the first sealing section 50 (refer to FIG. 1) is provided may be taken.

The semiconductor chip package 10 contains the first semiconductor chip 20. The first semiconductor chip 20 has the configuration described using FIGS. 4 and 5. That is, the first semiconductor chip 20 has a plurality of first bumps 22. The plurality of first bumps 22 are arranged along the edges of an upper surface 20a of the first semiconductor chip 20. A glass plate 24 is provided on a lower surface 20b of the first semiconductor chip 20 to protect a movable structure thereof.

Also the semiconductor chip package 10 includes the second semiconductor chip 30. The second semiconductor chip 30 has a first surface 30a and a second surface 30b opposite to the first surface 30a. The second semiconductor chip 30 has a plurality of second bumps 32 arranged on the first surface 30a side along the edges of the first surface 30a.

The semiconductor chip package 10 includes the ceramic header 40. The characteristic configuration of the ceramic header 40 is as mentioned above.

The ceramic header 40 has a first main surface 40a and a second main surface 40b opposite to the first main surface 40a. The ceramic header 40 has a plurality of electrode pads 42 provided on the first main surface 40a side. Layout positions of these plural electrode pads 42 and the number thereof may be set in accordance with the first and second bumps 22 and 32 of the first and second semiconductor chips 20 and 30, which are connected to their corresponding electrode pads 42.

Further, the ceramic header 40 has a plurality of external terminals 44. The external terminals 44 are provided on the second main surface 40b side.

While the ceramic header 40 is illustrated in the figure as one having a single-layered wiring structure in the present example, it may of course have a so-called multilayered wiring structure. The ceramic header 40 has a first wiring layer 41 including a plurality of wiring sections. A first insulating film 43 is provided on the first wiring layer 41 so as to cover the first wiring layer 41. The first insulating film 43 is provided with openings, which expose parts of the wiring sections of the first wiring layer 41. The exposed sections or parts of the first wiring layer 41 are configured as the electrode pads 42. The electrode pads 42 include first semiconductor chip connecting pads 42a and second semiconductor chip connecting pads 42b respectively in the present example.

The ceramic header 40 has a second wiring layer 45 including a plurality of wiring sections. A second insulating film 46 is provided on the second wiring layer 45 so as to cover the second wiring layer 45. The second insulating film 46 is provided with openings, which expose parts of the wiring sections of the second wiring layer 45. The exposed sections of the second wiring layer 45 are configured as the external terminals 44.

The first and second semiconductor chips 20 and 30 are mounted over the ceramic header 40. The first and second semiconductor chips 20 and 30 are respectively mounted on the first main surface 40a side in parallel with each other. That is, they are mounted on the ceramic header 40 in such a manner that their contours do not overlap each other when viewed from the upper surface side. The first and second semiconductor chips 20 and 30 are disposed and mounted within the inner area 40ab surrounded by the side wall section 49. That is, the first and second semiconductor chips 20 and 30 are mounted with being accommodated within the concave portion 49a so as to become lower than the height of the side wall section 49.

The first bumps 22 of the first semiconductor chip 20 and the second bumps 32 of the second semiconductor chip 30 are respectively directly, so-called flip-chip connected to the electrode pads 42 in opposing relationship to the electrode pads 42.

In the present example, the first semiconductor chip 20 has the closed ring-shaped adhesive 29. Thus, the closed ring-shaped adhesive 29, i.e., the adhesive sealing section 29 defines a closed space between the upper surface 20a of the first semiconductor chip 20 and the first main surface 40a of the substrate 40. Accordingly, the movable structure of the first semiconductor chip 20 is encapsulated in the closed space in a ready or operable condition.

The semiconductor chip package 10 is provided with a second sealing section 60. The second sealing section 60 seals the first semiconductor chip 20, the second semiconductor chip 30 and the first main surface 40a of the substrate 40 so as to cover them from above except for the space defined between the first semiconductor chip 20 and the substrate 40, i.e., a gap area defined by the adhesive sealing section 29. As the second sealing section 60, an arbitrary and suitable liquid resin or the like known to date can be applied.

According to such a package, the plurality of semiconductor chips are accommodated in the concave portion of the ceramic header and brought into a packaged form in parallel with one another. It is therefore possible to make its thickness thinner. The ceramic header and the semiconductor chips are so-called flip-chip connected to one another. Thus, remarkable miniaturization of the semiconductor chip package is realized. The so-called ceramic header is so high in rigidity. It is thus possible to more effectively protect the movable structure of the semiconductor chip brittle against shock, i.e., stress.

Since a method for manufacturing the semiconductor chip package 10 according to the second embodiment remains unchanged as compared with the first embodiment except that the substrate is configured as the ceramic header, its detained description will be omitted.

While the preferred forms of the present invention have been described, it is to be understood that modifications will be apparent to those skilled in the art without departing from the spirit of the invention. The scope of the invention is to be determined solely by the following claims.

What is claimed is:

1. A semiconductor chip package comprising:
   a first semiconductor chip constituted as an MEMS chip including,
      a frame section having an upper surface and a lower surface opposite to the upper surface,
      a movable structure including a movable section provided in the frame section, and
      a plurality of first bumps arranged on the upper surface side of the frame section along edges of the upper surface;
   a second semiconductor chip having a first surface and a second surface opposite to the first surface and having a plurality of second bumps arranged on the first surface side along edges of the first surface;
   a substrate having a first main surface and a second main surface opposite to the first main surface and on which the first and second semiconductor chips are mounted on the first main surface side in parallel with each other, said substrate having a plurality of electrode pads provided on the first main surface side and respectively directly connected to the first or second bumps in opposing relationship to the first or second bumps, and having external terminals respectively connected to the electrode pads and provided on the second main surface side;
a closed ring-shaped first sealing section which seals a space between the frame section and the substrate so as to surround arrangements of a plurality of the first bumps; and
a second sealing section which covers the first semiconductor chip, the second semiconductor chip, the first sealing section and the first main surface to seal the same.

2. The semiconductor chip package according to claim 1, wherein the first semiconductor chip is an acceleration sensor chip having the frame section defining an opening extending from the upper surface to the lower surface, the movable structure including a beam section extending from the frame section to within the opening and the movable section held in the opening and movably supported by the beam section, detecting elements which detect displacements of the movable structure, and a plurality of the first bumps respectively electrically connected to the detecting elements.

3. The semiconductor chip package according to claim 1, wherein the first semiconductor chip further has a closed ring-shaped adhesive which exposes parts of the first bumps and are provided in the lower surface along edge portions of the lower surface, and
wherein the first semiconductor chip includes an adhesive sealing section formed in place of the first sealing section by allowing the adhesive to bond the frame section and the substrate to each other, and a second sealing section which covers the first semiconductor chip, the second semiconductor chip, the adhesive sealing section and the first main surface to seal the same.

4. The semiconductor chip package according to any one of claim 1, wherein the second semiconductor chip is a control chip which controls the operation of the first semiconductor chip.

5. The semiconductor chip package according to any one of claim 1, wherein the first bumps of the first semiconductor chip further include one or two or more electrically non-conducting dummy bumps.

6. The semiconductor chip package according to any one of claim 1, wherein the substrate is a ceramic header which is further provided, in areas outside arrangements of the electrode pads, corresponding to edge areas of the first main surface, with a side wall section defining a concave portion so as to surround an inner area of the first main surface upright in a direction orthogonal to the first main surface.

7. A semiconductor chip which is an MEMS chip, comprising:
a frame section having an upper surface and a lower surface opposite to the upper surface and defining an opening extending from the upper surface to the lower surface;
a movable structure including a beam section extending from the frame section to within the opening and a movable section held in the opening and movably supported by the beam section, detecting elements which detect displacements of the movable structure, and a plurality of first bumps which are respectively electrically connected to the detecting elements and which are arranged on the upper surface side of the frame section along edges of the upper surface and include one or two more electrically-nonfunctional dummy bumps.

8. The semiconductor chip according to claim 7, further including a closed ring-shaped adhesive which exposes parts of the first bumps and are provided along the edges of the upper surface of the frame section.

9. A method for manufacturing a semiconductor chip package, comprising the steps of:
preparing a first semiconductor chip corresponding to an MEMS chip including a frame section having an upper surface and a lower surface opposite to the upper surface, a movable structure including a movable section provided in the frame section, and a plurality of first bumps arranged on the upper surface side of the frame section along edges of the upper surface;
preparing a second semiconductor chip having a first surface and a second surface opposite to the first surface and having a plurality of second bumps arranged on the first surface side along edges of the first surface;
preparing a substrate having a first main surface and a second main surface opposite to the first main surface, a plurality of electrode pads provided on the first main surface side and respectively directly connected to the first or second bumps in opposing relationship to the first or second bumps, and external terminals respectively connected to the electrode pads and provided on the second main surface side;
connecting the electrode pads of the substrate and the first or second bumps and mounting the first and second semiconductor chips onto the substrate in parallel with each other on the first main surface side;
forming a closed ring-shaped first sealing section which surrounds arrangements of the plurality of first bumps to seal a space between the frame section of the first semiconductor chip and the substrate; and
forming a second sealing section which covers the first semiconductor chip, the second semiconductor chip, the first sealing section and the first main surface to seal the same.

10. The method according to claim 9, wherein the step for preparing the first semiconductor chip is a step for preparing an acceleration sensor chip having the frame section defining an opening extending from the upper surface to the lower surface, the movable structure including a beam section extending from the frame section to within the opening and the movable section held in the opening and movably supported by the beam section, detecting elements which detect displacements of the movable structure, and a plurality of the first bumps respectively electrically connected to the detecting elements.

11. The method according to any one of claim 9, wherein the step for preparing the first semiconductor chip is a step for preparing the first semiconductor chip further provided with first bumps including electrically-nonconducting one or two or more dummy bumps arranged on the upper surface side of the frame section along the edges of the upper surface.

12. The method according to any one of claim 9, wherein the step for preparing the substrate is a step for preparing a ceramic header which is further provided, in areas outside arrangements of the electrode pads, corresponding to edge areas of the first main surface, with a side wall section defining a concave portion so as to surround an inner area of the first main surface upright in a direction orthogonal to the first main surface.

13. A method for manufacturing a semiconductor chip package, comprising the steps of:

preparing a first semiconductor chip including a frame section having an upper surface and a lower surface opposite to the upper surface, a movable structure including a movable section provided in the frame section, a plurality of first bumps arranged on the upper surface side of the frame section along edges of the upper surface, and a closed ring-shaped adhesive which exposes parts of the first bumps and are provided on the upper surface along the edges of the upper surface;

preparing a second semiconductor chip having a first surface and a second surface opposite to the first surface and having a plurality of second bumps arranged on the first surface side along edges of the first surface;

preparing a substrate having a first main surface and a second main surface opposite to the first main surface, a plurality of electrode pads provided on the first main surface side and respectively directly connected to the first or second bumps in opposing relationship to the first or second bumps, and external terminals respectively connected to the electrode pads and provided on the second main surface side;

connecting the electrode pads of the substrate and the first or second bumps, mounting the first and second semiconductor chips onto the substrate in parallel with each other on the first main surface side, and mounting the first semiconductor chip in such a manner that the closed ring-shaped adhesive serves as a closed ring-shaped adhesive sealing section which bonds the frame section and the substrate to each other; and forming a second sealing section which covers the first semiconductor chip, the second semiconductor chip, the adhesive sealing section and the first main surface to seal the same, except for an area defined by the adhesive sealing section, which corresponds to a space defined between the first semiconductor chip and the substrate.

14. The method according to claim 13, wherein the step for preparing the first semiconductor chip is a step for preparing an acceleration sensor chip having the frame section defining an opening extending from the upper surface to the lower surface, the movable structure including a beam section extending from the frame section to within the opening and the movable section held in the opening and movably supported by the beam section, detecting elements which detect displacements of the movable structure, and a plurality of the first bumps respectively electrically connected to the detecting elements.

15. The method according to any one of claim 13, wherein the step for preparing the first semiconductor chip is a step for preparing the first semiconductor chip further provided with first bumps including electrically-nonconducting one or two or more dummy bumps arranged on the upper surface side of the frame section along the edges of the upper surface.

16. The method according to any one of claim 13, wherein the step for preparing the substrate is a step for preparing a ceramic header which is further provided, in areas outside arrangements of the electrode pads, corresponding to edge areas of the first main surface, with a side wall section defining a concave portion so as to surround an inner area of the first main surface upright in a direction orthogonal to the first main surface.

* * * * *